(12) United States Patent
Huang

(10) Patent No.: US 12,165,304 B2
(45) Date of Patent: Dec. 10, 2024

(54) MEASUREMENT MAP CONFIGURATION METHOD AND APPARATUS

(71) Applicant: Changxin Memory Technologies, Inc., Anhui (CN)

(72) Inventor: Jen-Chou Huang, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 416 days.

(21) Appl. No.: 17/673,258

(22) Filed: Feb. 16, 2022

(65) Prior Publication Data

US 2023/0013886 A1   Jan. 19, 2023

Related U.S. Application Data

(63) Continuation of application No. PCT/CN2021/120357, filed on Sep. 24, 2021.

(30) Foreign Application Priority Data

Jul. 13, 2021   (CN) .......................... 202110792151.5

(51) Int. Cl.
*G06T 7/00* (2017.01)
*G06V 10/74* (2022.01)

(52) U.S. Cl.
CPC ............ *G06T 7/0004* (2013.01); *G06V 10/74* (2022.01); *G06T 2207/30148* (2013.01); *G06T 2207/30242* (2013.01)

(58) Field of Classification Search
CPC ......... G06T 7/0004; G06T 2207/30148; G06T 2207/30242; G06V 10/74

(Continued)

(56) References Cited

U.S. PATENT DOCUMENTS

| | | | |
|---|---|---|---|
| 2004/0031779 A1* | 2/2004 | Cahill | B23K 26/0853 257/E23.179 |
| 2005/0188342 A1 | 8/2005 | Goodwin | |
| 2022/0057716 A1* | 2/2022 | Frisco | G03F 7/70508 |

FOREIGN PATENT DOCUMENTS

| | | |
|---|---|---|
| CN | 101452217 A | 6/2009 |
| CN | 110908256 A | 3/2020 |
| WO | 2020/126774 A1 | 6/2020 |

OTHER PUBLICATIONS

PCT International Search Report and the Written Opinion mailed Mar. 30, 2022, issued in related International Application No. PCT/CN2021/120357, with English translation (5 pages).

(Continued)

*Primary Examiner* — Michael R Neff
(74) *Attorney, Agent, or Firm* — Sheppard Mullin Richter & Hampton LLP

(57) ABSTRACT

Embodiments of this invention provide a measurement map configuration method and apparatus. A wafer to be inspected is provided. The wafer includes a plurality of inspection marks. A first inspection result is obtained based on a first set of inspection marks. A second set of inspection marks is selected based on a preset rule. The second set of inspection marks is less than the first set of inspection marks. A second inspection result is obtained based on the second set of inspection marks. If an overlay accuracy of the second inspection result matches an overlay accuracy the first inspection result, a measurement map for the wafer is set based on target inspection marks. The target inspection marks are the second set of inspection marks of the measurement map.

20 Claims, 3 Drawing Sheets

(58) Field of Classification Search
USPC .......................................................... 382/145
See application file for complete search history.

(56) References Cited

OTHER PUBLICATIONS

PCT International Preliminary Report on Patentability mailed Jan. 25, 2024, issued in related International Application No. PCT/CN2021/120357, with English translation (10 pages).

* cited by examiner

MEASUREMENT MAP CONFIGURATION METHOD AND APPARATUS

CROSS-REFERENCE TO RELATED APPLICATIONS

This application is a continuation application of International Patent Application No.: PCT/CN2021/120357, filed on Sep. 24, 2021, which claims priority to Chinese Patent Application No.: 202110792151.5, filed on Jul. 13, 2021. The above-referenced applications are incorporated herein by reference in their entirety.

TECHNICAL FIELD

Various embodiments of this invention relate to the technical field of semiconductors.

BACKGROUND

To measure the overlay accuracy of different layers on a wafer, a full measurement map may be designed to measure various inspection marks of exposure regions on the wafer. However, measuring the overlay accuracy using the full measurement map may consume a lot of time, which may decrease production capacity. To save time and improve production capacity, a portion of the inspection marks may be randomly selected from the full measurement map, as candidate inspection marks to inspect the wafer. However, such an approach may have drawbacks. For example, the candidate inspection marks may not cover all of the exposure regions on the wafer, which may affect comprehensiveness of the overlay accuracy measurement.

Therefore, configuring a measurement map that can satisfy comprehensiveness of the overlay accuracy measurement and reduce the amount of measurement is a technical problem urgently need to be solved in this field.

SUMMARY

Embodiments of this invention provide a measurement map configuration method and apparatus, for determining a measurement map used when measuring an overlay accuracy of a wafer, so that the measurement map not only can satisfy comprehensiveness of measurement, but also reduce an amount of measurement.

Various embodiments of this invention provide a measurement map configuration method comprising: providing a wafer to be inspected, wherein the wafer includes a plurality of inspection marks; obtaining a first inspection result based on a first set of inspection marks; selecting, based on a preset rule, a second set of inspection marks, wherein the second set of inspection marks is less than the first set of inspection marks; obtaining a second inspection result based on the second set of inspection marks, wherein an overlay accuracy of the second inspection result matches an overlay accuracy the first inspection result; and setting a measurement map for the wafer based on target inspection marks, wherein the target inspection marks are the second set of inspection marks of the measurement map.

Various embodiments of this invention provide a measurement map configuration apparatus to implement the measurement map configuration method provided above. The apparatus includes a first inspection result obtaining module configured to obtain a first inspection result of a wafer based on a first set of inspection marks on the wafer; a selection module configured to select, based on a preset rule, a second set of inspection marks on the wafer, wherein the second set of inspection marks is less than the first set of inspection marks; a second inspection result obtaining module configured to obtain a second inspection result of the wafer based on the second set of inspection marks; a matching module configured to determine a match between an overlay accuracy of the second inspection result and an overlay accuracy of the first inspection result; and a setting module configured to set a measurement map of the wafer based on the second set of inspection marks, wherein the second set of inspection marks are target inspection marks of the measurement map.

BRIEF DESCRIPTION OF THE DRAWINGS

To explain various embodiments of this invention or technical solutions of prior art more clearly, accompanying drawings used in describing the embodiments or the prior art will be briefly described below. Clearly, the accompanying drawings are only associated with some of the embodiments of this invention. A person of ordinary skill in the art may further ascertain other embodiments based on these accompanying drawings without creative efforts.

DETAILED DESCRIPTION OF THE EMBODIMENTS

The following discussion clearly and completely describes technical solutions of various embodiments of this invention with reference to accompanying drawings. Clearly, the embodiments described herein are merely exemplary embodiments of this invention. Other embodiments ascertained by a person with ordinary skill in this field based on the embodiments described herein and without any creative effort are included in the protected scope of this invention.

The terms "first," "second," "third," "fourth," and the like, if existent, in the specification, claims, and the accompanying drawings of the embodiments of this invention are used to distinguish between similar objects and are not intended to describe a particular order or precedence. It should be understood that the terms used in such way are interchangeable where appropriate, so that the embodiments of this invention described herein can be, for example, practiced in order other than those illustrated or described herein. In addition, the terms "comprise/include" and "have" and any variations thereof are intended to cover a non-exclusive meaning, for example, processes, methods, systems, products, or devices including a series of steps or units are not necessarily limited to those steps or units clearly listed, but may include other steps or units that are not explicitly listed or inherent to such processes, methods, products, or devices.

Various embodiments of this invention provide a method and apparatus for configuring a measurement map for used in semiconductor manufacturing to measure an overlay accuracy of a wafer. The measurement map not only can satisfy comprehensiveness of the overlay accuracy, the measurement map can also reduce an amount of measurement to be performed on the wafer, thereby improving yields of semiconductor devices on the wafer. Technical solutions of this invention are described in detail below with specific embodiments. The following embodiments may be combined with each other.

Figure 1:
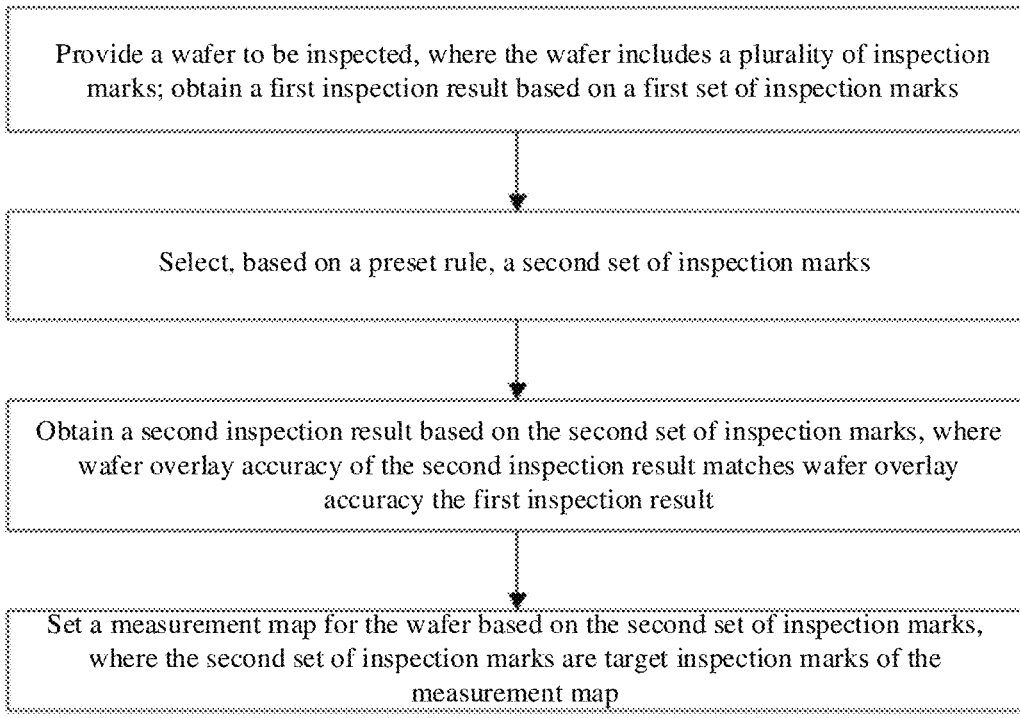
FIG. 1 illustrates a flowchart for configuring a measurement map according to an embodiment of this invention.

FIG. 1 illustrates a flowchart for configuring a measurement map according to an embodiment of this invention. The flowchart of FIG. 1 includes the following steps.

S101. Provide a wafer to be inspected and obtain a first inspection result based on a first set of inspection marks of the wafer.

Figure 2:
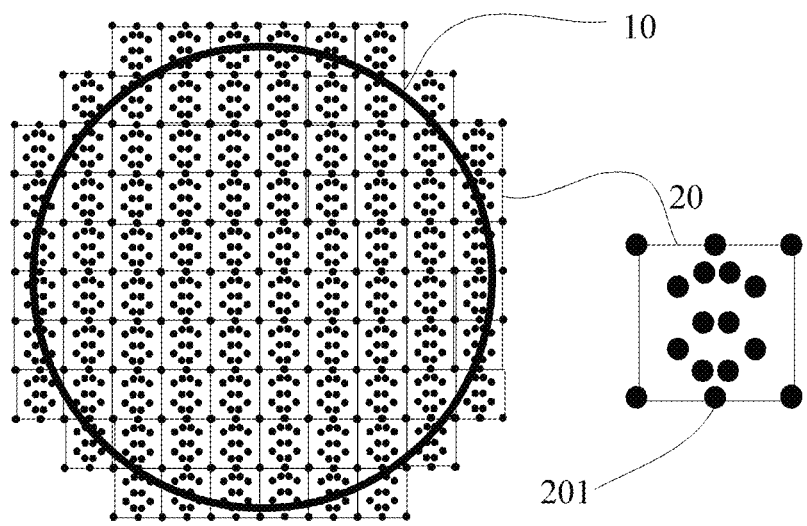
FIG. 2 illustrates a full measurement map of a wafer comprising a plurality of inspection marks according to an embodiment of this invention.

For example, FIG. 2 illustrates a full measurement map of a wafer 10 comprising a plurality of inspection marks 201 according to an embodiment of this invention. To fully and accurately inspect an overlay accuracy of the wafer 10, all of the plurality of inspection marks 201 on the wafer 10 may be selected for measurement. For example, in the full measurement map of FIG. 2, the wafer 10 includes a plurality of repeated exposure units 20 (e.g., semiconductor devices). In this example, respective positions of inspection marks within each of the plurality of repeated exposure units 20 are identical relative to each other. For instance, as shown in FIG. 2, each of the plurality of repeated exposure units 20 can be provided sixteen inspection marks. These sixteen inspection marks can be disposed at four vertices and along edges of the four vertices, an upper midpoint, a lower midpoint, and a middle part of each of the plurality of repeated exposure units 20. For example, a photomask template may be designed to include sixteen inspection marks corresponding to the sixteen inspection marks on each of the repeated exposure units 20. A wafer can be exposed by using the photomask template to obtain a pattern on the wafer to be inspected. The plurality of repeated exposure units 20 is formed on the wafer based on the pattern provided by the photomask template. In addition, respective positions of the sixteen inspection marks in each of the plurality repeated exposure units 20 are identical relative to each other.

In some embodiments, a first set of inspection marks may include inspection marks that are disposed at four vertices of repeated exposure units that are located along a circular edge region of the wafer 10 and all inspection marks of repeated exposure units located internally to the circular edge region of the wafer 10. Each of the repeated exposure units located in the circular edge region of the wafer 10 may be understood as repeated exposure units intersecting with an edge of the wafer 10, and only parts of the repeated exposure units located in the circular edge region of the wafer 10 are on the wafer 10. Each of the repeated exposure units located internally to the circular edge region of the wafer 10 may be understood as repeated exposure units that are entirely on the wafer 10.

In other embodiments, the first set of inspection marks may include only inspection marks of repeated exposure units that are located within the circular edge region of the wafer 10.

For example, a measurement machine may be used to perform an overlay accuracy measurement based on a measurement map comprising a first set of inspection marks. Through the measurement map a first inspection result can be obtained. The first inspection result may be used as matching information (e.g., a baseline measurement) of a subsequently determined measurement map.

S102. Select, based on a preset rule, a second set of inspection marks, where the second set of inspection marks is less than the first set of inspection marks.

For example, in S102, one or more inspection marks may be selected, by using a preset rule, from the first set of inspection marks of the full measurement map of FIG. 2, as target inspection marks, to perform subsequent inspections. The subsequent inspections can be performed with less inspection marks than the first set of inspection marks.

In some embodiments, the preset rule can include at least four rules. When two or more of the at least four rules are applied at the same time, it is understood that the two or more of the at least four rules are satisfied at the same time. The at least four rules are described below.

Rule 1: determining that a sum of target inspection marks located at identical positions within each of the plurality of repeated exposure units 20 of the wafer 10 is equal. Alternatively, or in addition, determining that a sum of target inspection marks located at any two positions within each of the plurality of repeated exposure units 20 differs by a first threshold value.

Figure 3:
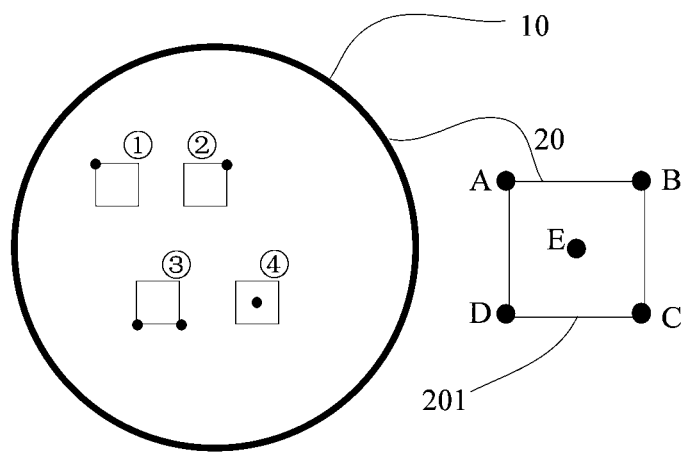
FIG. 3 illustrates a measurement map of a wafer to which a preset rule is to be applied according to an embodiment of this invention.

For example, referring to FIG. 3. FIG. 3 illustrates a measurement map of a wafer to which a preset rule is to be applied according to an embodiment of this invention. In this example, five inspection positions are selected from the plurality of repeated exposure units 20 as target inspection marks. The five inspection positions are respectively located in repeated exposure units labeled ①, ②, ③, and ④. As shown in FIG. 3, the five inspection positions are respectively located in an upper left corner A of the repeated exposure unit ①, an upper right corner B of the repeated exposure unit ②, a lower right corner C and a lower left corner D of the repeated exposure unit ③, and a middle position E of the repeated exposure unit ④. In this example, a sum of target inspection marks located at identical positions in each of the plurality of repeated exposure units 20 may be understood as a number of target inspection marks located at identical positions in the plurality of repeated exposure units 20. For instance, as shown in FIG. 3, there is only one target inspection mark located at position A of the repeated exposure unit ①. Therefore, a sum of target inspection marks located at position A in each of the plurality of repeated exposure units 20 is 1. Similarly, there is only one target inspection mark located at position B of the repeated exposure unit ②. Therefore, a sum of target inspection marks located at position B in each of the plurality of repeated exposure units 20 is 1. Similarly, there is only one target inspection mark located at position C of the repeated exposure unit ③. Therefore, a sum of target inspection marks located at position C in each of the plurality of repeated exposure units 20 is 1. Similarly, there is only one target inspection mark located at position D of the repeated exposure unit ③. Therefore, a sum of target inspection marks located at position D in each of the plurality of repeated exposure units 20 is 1. Similarly, there is only one target inspection mark located at position E of the repeated exposure unit ④. Therefore, a sum of target inspection marks located at position E in each of the plurality of repeated exposure units 20 is 1. As such, in this example, the sum of target inspection marks located at position A in each of the plurality of repeated exposure units 20, the sum of target inspection marks located at position B in each of the plurality of repeated exposure units 20, the sum of target inspection marks located at position C in each of the plurality of repeated exposure units 20, the sum of target inspection marks located at position D in each of the plurality of repeated exposure units 20, and the sum of target inspection marks located at position E in each of the plurality of repeated exposure units 20 are all 1.

When the inspection mark in the upper left corner of the repeated exposure unit ① is determined as a target inspection mark, a count A0 of the inspection mark is added or incremented by 1. Similarly, when the inspection mark in the upper right corner of the repeated exposure unit ② is determined as a target inspection mark, a count B0 of the inspection mark is added by 1, and so on. After the second set of inspection marks is determined, from the plurality of repeated exposure units 20, as target inspection marks, a number of target inspection marks at each position of the plurality of repeated exposure units 20 can be obtained and denoted as A0, B0, C0, D0, and E0. Therefore, to obtain a more balanced measurement map, in rule 1, numbers A0, B0, C0, D0, and E0 at each of the positions are required to be equal. For example, all of the numbers A0, B0, C0, D0, and E0 are 10. Alternatively, or in addition, differences between the numbers A0, B0, C0, D0, and E0 at each of the positions are required to be less than a first threshold value. For example, A0=10, B0=12, C0=10, D0=10, and E0=11, with a maximum difference being 2, which is less than a first threshold value of 3.

In some embodiments, satisfaction of rule 1 can be represented by a first weight. For example, when it is determined that differences between the numbers A0, B0, C0, D0, and E0 at each of the positions are greater than or equal to the first threshold value, the first weight can be set to 0. Subsequently, a selection of inspection marks as target inspection marks is adjusted according to rule 1, until the differences between the numbers A0, B0, C0, D0, and E0 are less than the first threshold value, at which point, the first weight becomes 1. Accordingly, the first weight can indication a selection of inspection marks as target inspection marks satisfying rule 1.

Rule 2: for the plurality of repeated exposure units 20 in which one or more target inspection marks exist, determining a number of target inspection marks in each of the repeated exposure units 20 being equal or similar so that a number of target inspection marks in any two repeated exposure units of the plurality of repeated exposure units 20 are equal. Alternatively, or in addition, determining a number of target inspection marks in any two repeated exposure units of the plurality of repeated exposure units 20 differs by a second threshold value.

For example, again referring to FIG. 3. When a second set of inspection marks is determined as target inspection marks from the plurality of repeated exposure units 20, an inspection mark in the upper left corner of the repeated exposure unit 1̂ is used as a target inspection mark and a number of repeated exposure units in the plurality of repeated exposure units 20 is denoted as ①-1. When two inspection marks in lower left corner and lower right corner of the repeated exposure unit ③ are used as target inspection marks, a number of repeated exposure units is denoted as ③-2 and so on. In this example of FIG. 3, after the second set of inspection marks are determined, numbers of target inspection marks in the plurality of repeated exposure units 20 may be labeled as ①-1, ②-1, ③-2, and ④-1, respectively. According to rule 2, numbers of target inspection marks in the plurality of repeated exposure units 20 are required to be equal. For example, the repeated exposure unit ①, the repeated exposure unit ②, the repeated exposure unit ③, the repeated exposure unit ④ all equal 1. Alternatively, or in addition, differences in numbers of target inspection marks in the plurality of repeated exposure units 20 are required to be similar with a difference with the second threshold value. For example, differences in numbers of target inspection marks in the plurality of repeated exposure units 20 have a maximum value 2 (i.e., the exposure unit ③) and a minimum value 1 (i.e., the repeated exposure unit ①, the repeated exposure unit ②, and the repeated exposure unit ④). In this example, assuming that the second threshold value of 2, the inspection mark in the upper left corner of the repeated exposure unit ①, the inspection mark in the upper right corner of the repeated exposure unit ②, the inspection marks in the lower left corner and the lower right corner of the repeated exposure unit ③, the inspection mark in the middle position of the repeated exposure unit ④ are selected as target inspection marks.

In some embodiments, rule 2 can be represented by a second weight. For example, when it is determined that numbers of target inspection marks in the plurality of repeated exposure units 20 are not exactly the same and differences between the numbers of target inspection marks are greater than or equal to the second threshold value, the second weight is 0. Subsequently, a selection of inspection marks as target inspection marks are adjusted according to rule 2 until the numbers of target inspection marks in each of the plurality of repeated exposure units 20 are equal or differ by a value less than the second threshold value, at which point, the second weight obtained becomes 1. It is then determined that the selected inspection marks as target inspection marks satisfy rule 2.

Rule 3: setting any two inspection marks having a longest distance within a repeated exposure unit as target inspection marks.

Figure 4:
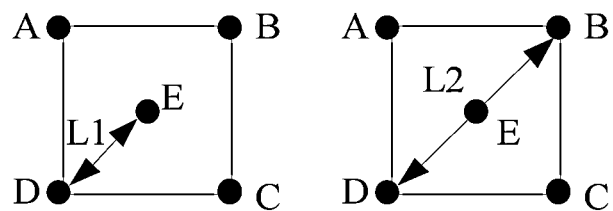
FIG. 4 illustrates a measurement map of a repeated exposure unit according to an embodiment of this invention.

For example, referring to FIG. 4. FIG. 4 illustrates a measurement map of a repeated exposure unit according to an embodiment of this invention. Any one of the plurality of repeated exposure units 20 can be used as an example. In FIG. 4, it is assumed that a number of target inspection marks selected from a repeated exposure unit is greater than 2, and target inspection marks need to be selected from two inspection marks that have a longest distance within the repeated exposure unit. For example, as shown in FIG. 4, the repeated exposure unit includes five inspection marks A-E. In this example, in the left diagram of FIG. 4, if inspection marks D and E are used as target inspection marks, a distance between the inspection marks D and E is L1. As shown in the right diagram of FIG. 4, if inspection marks B and D are used as target inspection marks, a distance between the inspection marks B and D is L2. In this example, because the repeated exposure unit is substantially a rectangle (or substantially a square), a distance between inspection marks A and C is also L2. It can be seen from FIG. 4 that a distance between two inspection marks in the right diagram of FIG. 4 is the longest in the repeated exposure unit. Therefore, in this example, target inspection marks needed be to included are the two inspection marks B and D (or A and C).

Rule 4: setting any three of inspection marks by which a triangle formed that has a largest area within a repeated exposure unit as target inspection marks.

Figure 5:
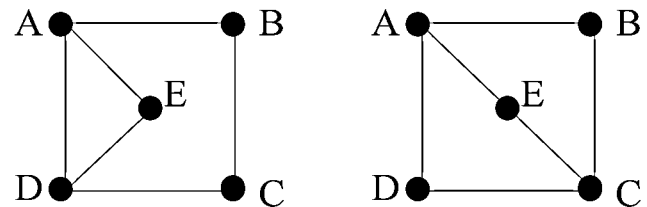
FIG. 5 illustrates a measurement map of a repeated exposure unit according to still another embodiment of this invention.

For example, referring to FIG. 5. FIG. 5 illustrates a measurement map of an exposure unit according to an embodiment of this invention. Any one of the plurality of repeated exposure units 20 can be used as an example. In FIG. 5, it is assumed that a number of target inspection marks selected from the repeated exposure unit is greater than 3, and target inspection marks need to be selected are from three inspection marks by which a triangle having a largest area is formed. For example, in FIG. 5, the repeated exposure unit includes five inspection marks A-E. An area of a triangle formed by the inspection marks A, D, and E is shown in the left diagram of FIG. 5. This triangle is less than an area of a triangle formed by the inspection marks A, C, and D as shown in the right diagram of FIG. 5. It can be seen that the area of the triangle formed by the inspection marks A, C, and D is the largest triangle. Therefore, in this example, target inspection marks needed to be included are the inspection marks A, C, and D which form a triangle having the largest area.

Figure 6:
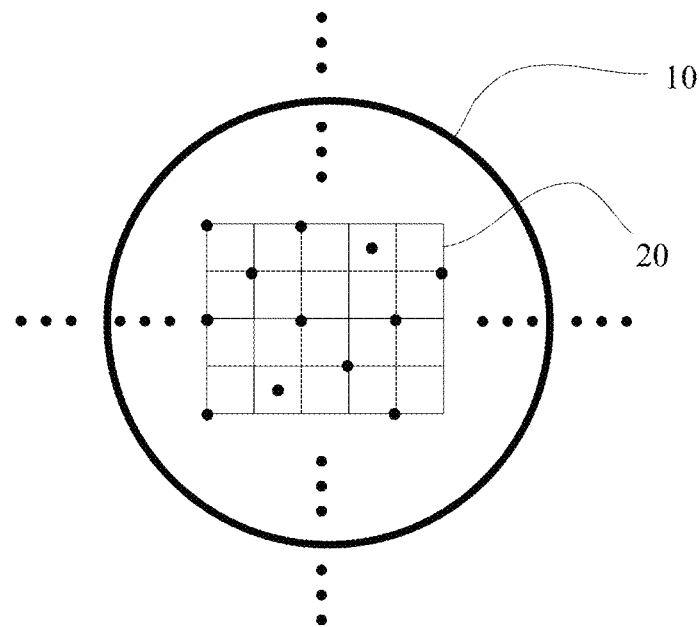
FIG. 6 illustrates a measurement map of a wafer according to an embodiment of this invention.

FIG. 6 illustrates a measurement map of a wafer according to an embodiment of this invention. FIG. 6 shows a plurality of repeated exposure units. It can be seen that each of the plurality repeated exposure units includes a similar number of target inspection marks. In addition, a number of target inspection marks at identical positions in each of the plurality of repeated exposure units is equal or similar, and includes two target inspection marks having a longest distance, so that the target inspection marks are not centralized in particular regions of the wafer or repeated exposure units. Instead, the target inspection markers are arranged uniformly and dispersedly as far as possible, thereby improving determining an overlay accuracy of the wafer more comprehensively.

S103. Obtain a second inspection result based on the second set of inspection marks obtained in S102, where an overlay accuracy of the second inspection result matches an overlay accuracy of the first inspection result.

In some embodiments, an inspection result can include parameters obtained through a measurement, such as, an average of an overlay accuracy of target inspection marks, a variance of the overlay accuracy of the target inspection marks, or a sum of the average of the overlay accuracy of the target inspection marks and three times the variance of the overlay accuracy of the target inspection marks (M3S). The overlay accuracy may include an offset in an X direction or a Y direction. For example, the first inspection result obtained based on the first set of inspection marks in S101 can include an average in the X direction: 0.02, an average in the Y direction: 0.05, a variance in the X direction: 1.5, a variance in the Y direction: 1.5, an M3S parameter in the X direction: 4.52, and an M3S parameter in the Y direction: 4.55. The second inspection result obtained based on the second set of inspection marks in S103 includes an average in X direction: 0.02, an average in Y direction: 0.02, a variance in X direction: 1.3, a variance in Y direction: 1.4, an M3S parameter in X direction: 3.92, and an M3S parameter in Y direction: 4.22.

After the first inspection result and the second inspection result are obtained, if differences between respective absolute values of each parameter of the first inspection result and the second inspection result are within the range of 0 to 1 nm, the first inspection result is determined or deemed to match the second inspection result, and a subsequent step can be performed. When there are one or more parameters that have differences greater than 1 nm between respective absolute values of the first inspection result and the second inspection result, the first inspection result is determined or deemed not to match the second inspection result, and S102 needs to be re-performed to obtain a different set of target inspection marks. When S102 is re-performed, at least one of a quantity or positions of target inspection marks may be reset. For example, the quantity of the target inspection units may be adjusted from 200 to 300, and subsequently the target inspection marks may be determined by performing S102.

As another examples, if one or more parameters of the first inspection result match that of the second inspection result, the first inspection result is determined or deemed to match the second inspection result, and a subsequent step can be performed. For example, if a difference between respective absolute values of M3S of the first inspection result and the second inspection result is within the range of 0 to 1 nm, the first inspection result is determined or deemed to match the second inspection result, and a subsequent step can be performed.

S104. Set a measurement map for the wafer based on the second set of inspection marks, where the second set of inspection marks are target inspection marks of the measurement map.

For example, if the second inspection result obtained based on the target inspection marks determined in S103 matches the first inspection result obtained by using the full measurement map in S101, it indicates that when using the target inspection mark to inspect an overlay accuracy of a wafer to be inspected, a measurement result similar to that obtained when using the full measurement map to inspect the overlay accuracy can be achieved. Therefore, the target inspection marks determined in S102 can be used as the measurement map to inspect subsequent wafers for overlay accuracy.

A measurement map configured in the embodiments of this invention is configured according to target inspection marks. Compared with a full measurement map, less inspection marks are used, which can reduce an amount of measurement required when inspecting overlay accuracy of a wafer and improve measurement efficiency. Meanwhile, a selection of target inspection marks of the measurement map can be uniformly and dispersedly arranged on repeated exposure units of the wafer, which can measure the overlay accuracy of the wafer more comprehensively. Therefore, the measurement map determined in the embodiments of this invention not only can satisfy comprehensiveness of measurements, but also can reduce an amount of measurement, thereby improving a measurement efficiency.

Figure 7:
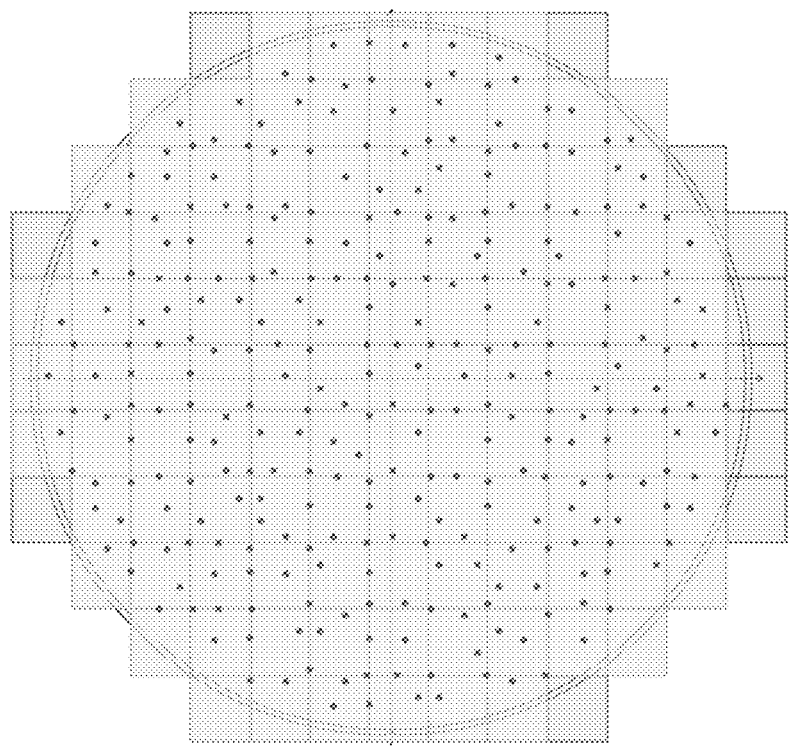
FIG. 7 illustrates a measurement map of a wafer according to an embodiment of this invention.

FIG. 7 illustrates a measurement map of a wafer according to an embodiment of this invention. FIG. 7 shows a measurement map comprising target inspection marks obtained using the flowchart of FIG. 1 provided herein. When compared to the full measurement map of FIG. 2, by using the measurement map of FIG. 7, an amount of measurement required when inspecting an overlay accuracy of a wafer and a measurement efficiency can be improved. Further, the overlay accuracy of the wafer can be measured more comprehensively.

In the foregoing embodiments, a measurement map configuration method is introduced. To implement various steps of the method provided by the embodiments of this invention, the steps can be implemented by an electronic device of an execution body. For example, hardware structure and/or a software module can be implemented in the form of a hardware structure, a software module, or a hardware structure and a software module to implement the steps of the method provided herein. Whether one of the above-mentioned steps is executed in the form of hardware structure, software module or hardware structure and software module depends on specific applications and design constraints of the technical solution.

An embodiment of this invention provides a measurement map configuration apparatus, including: a first inspection result obtaining module, a selection module, a second inspection result obtaining module, a matching module, and a setting module. The first inspection result obtaining module is configured to obtain a first inspection result of a wafer based on a first set of inspection marks on the wafer. The selection module is configured to select, based on a preset rule, a second set of inspection marks on the wafer, where the second set of inspection marks is less than the first set of inspection marks. The second inspection result obtaining module is configured to obtain a second inspection result of the wafer based on the second set of inspection marks. The matching module is configured to determine a match between an overlay accuracy of the second inspection result and an overlay accuracy of the first inspection result. The setting module is configured to set a measurement map of the wafer based on the second set of inspection marks, where the second set of inspection marks are target inspection marks of the measurement map. The detailed principle and implementation of steps respectively performed by each module in the measurement map configuration apparatus can be referred to the measurement map configuration method in the foregoing embodiment of this invention and will not be described in detail.

It should be noted that division of modules of the above apparatus is only a logical function division, which can be completely or partially integrated into a physical entity or physically separated in actual implementation. These modules can all be implemented in the form of software invoking through processing elements, or can also be implemented in the form of hardware. Some modules can also be implemented in the form of software invoked by processing elements, and some modules can be implemented in the form of hardware. It can be a separate processing element or can be integrated in a chip of the apparatus. In addition, it can also be stored in the memory of the apparatus in the form of program code, and the function of the selection module can be invoked and executed by a processing element of the apparatus. The implementation of other modules is similar. In addition, all or part of the modules can be integrated or implemented independently. The processing element described herein may be an integrated circuit with signal processing capability. In an implementation, the steps or modules of the method may be accomplished by integrated logic circuits of hardware in the processor element or by instructions in the form of software.

For example, the modules may be one or more integrated circuits configured to implement the foregoing methods, such as one or more invention specific integrated circuits (ASIC), or one or more microprocessors (DSP), or one or more field programmable gate arrays (FPGA), or the like. In another example, when one of the foregoing modules is implemented in the form of a processing element scheduler code, the processing element may be a general purpose processor, such as a central processing unit (CPU) or other processor that can invoke the program code. For another example, the modules can be integrated and implemented in the form of system-on-a-chip (SOC).

In the above-mentioned embodiments, it may be implemented in whole or in part by software, hardware, firmware, or any combination thereof. When implemented in software, it can be implemented in whole or in part in the form of a computer program product. The computer program product includes one or more computer instructions. When the computer program instructions are loaded and executed on a computer, the processes or functions described in accordance with the embodiments of this invention are generated in whole or in part. The computer may be a general purpose computer, a special purpose computer, a computer network, or other programmable apparatus. The computer instructions may be stored in a computer-readable storage medium, or from one computer-readable storage medium to another. For example, the computer instructions may be transmitted from a website, computer, server, or data center to another website, computer, server, or data center via wired (for example, coaxial cable, optical fiber, or digital subscriber line (DSL)) or wireless (for example, infrared, wireless, or microwave) manner. The computer-readable storage medium may be any usable medium accessible to a computer or a data storage device including a server, data center, or the like that is integrated with one or more usable media. The usable media may be magnetic media (for example, a floppy disk, a hard disk, or a magnetic tape), optical media (for example, DVD), a semiconductor medium (for example, a solid state disk (SSD)), or the like.

This invention further provides an electronic device, including a processor and a memory. The memory stores computer program, and the computer program, when being run by a processor, causes the processor to perform the measurement map configuration method according to any one of the embodiments of this invention.

This invention further provides a computer-readable storage medium. The computer-readable storage medium stores computer program, and the computer program, when being run, performs the measurement map configuration method according to any one of the embodiments of this invention.

The embodiments of this invention further provide a chip for executing the instructions, and the chip is configured to execute the measurement map configuration method executed by the electronic device in any one of the embodiments of this invention.

It could be appreciated by those of ordinary skill in the art that all or part of the steps to implement the above-mentioned method embodiments may be accomplished by program instructions associated with hardware. The program can be stored in a computer-readable storage medium. When the program is executed, the steps including the above method embodiments are executed; the storage medium includes: a variety of media on which program code can be stored, such as an ROM, an RAM, a magnetic disk, or a compact disc.

Finally, it should be noted that the above embodiments are only used to illustrate the technical solutions of this invention, but not to limit this invention. Although this invention has been described in detail with reference to the foregoing embodiments, a person of ordinary skill in the art shall understand that modifications may be made to the technical solutions described in the foregoing embodiments, or some or all of the technical features thereof may be equivalently substituted. However, these modifications or substitutions do not essentially depart the corresponding technical solutions from the scope of the technical solutions of the embodiments of this invention.

What is claimed is:

1. A measurement map configuration method comprising:
providing a wafer to be inspected, wherein the wafer includes a plurality of inspection marks;
obtaining a first inspection result based on a first set of inspection marks;
selecting, based on a preset rule, a second set of inspection marks, wherein a number of the second set of inspection marks is less than a number of the first set of inspection marks;
obtaining a second inspection result based on the second set of inspection marks, wherein an overlay accuracy of the second inspection result matches an overlay accuracy of the first inspection result;

setting a measurement map for the wafer based on target inspection marks, wherein the target inspection marks are the second set of inspection marks of the measurement map; and resetting at least one of a quantity or positions of the target inspection marks according to the preset rule when the overlay accuracy of the second inspection result does not match the overlay accuracy of the first inspection result.

2. The configuration method according to claim 1, wherein the wafer further comprises a plurality of repeated exposure units and each of the plurality of repeated exposure units includes one or more inspection marks, and wherein respective positions of the one or more inspection marks within each of the plurality of repeated exposure units are identical.

3. The configuration method according to claim 2, wherein the preset rule comprises:

determining a number of inspection marks located at identical positions in the plurality of repeated exposure units is equal; or determining a number of inspection marks located at any two positions in the plurality of repeated exposure units differs by less than a first threshold value.

4. The configuration method according to claim 3, wherein the preset rule further comprises:

determining a number of target inspection marks in any two repeated exposure units in which the target inspection marks exist being equal; or determining a number of target inspection marks in any two repeated exposure units in which the target inspection marks exist differs by less than a second threshold value.

5. The configuration method according to claim 4, wherein the preset rule further comprises:

setting any two inspection marks having a longest distance within a repeated exposure unit as the target inspection marks.

6. The configuration method according to claim 5, wherein the preset rule further comprises:

setting any three of inspection marks by which a triangle formed having a largest area within a repeated exposure unit as the target inspection marks.

7. The configuration method according to claim 1, wherein obtaining the first inspection result based on the first set of inspection marks comprises:

obtaining the first inspection result based on all of the plurality of inspection marks on the wafer.

8. The configuration method according to claim 1, wherein obtaining the second inspection result based on the second set of inspection marks comprises:

obtaining the second inspection result based on the second set of inspection marks so that overlay accuracy differences between the second inspection result and the first inspection result are in a range of 0 to 1 nm.

9. A measurement map configuration apparatus for inspecting a wafer, wherein the wafer includes a plurality of inspection marks, the apparatus comprising:

a first inspection result obtaining module circuit configured to obtain a first inspection result of the wafer based on a first set of inspection marks on the wafer;

a selection module circuit configured to select, based on a preset rule, a second set of inspection marks on the wafer, wherein a number of the second set of inspection marks is less than a number of the first set of inspection marks;

a second inspection result obtaining module circuit configured to obtain a second inspection result of the wafer based on the second set of inspection marks;

a matching module circuit configured to determine an overlay accuracy of the second inspection result matches an overlay accuracy of the first inspection result; and a setting module circuit configured to set a measurement map of the wafer based on target inspection marks, wherein the target inspection marks are the second set of inspection marks of the measurement map, and wherein the selection module circuit is further configured to reset at least one of a quantity or positions of the target inspection marks according to the preset rule, when the matching module circuit determines that the overlay accuracy of the second inspection result does not match the overlay accuracy of the first inspection result.

10. The configuration apparatus according to claim 9, wherein the wafer further comprise a plurality of repeated exposure units and each of the plurality of repeated exposure units includes one or more inspection marks, and wherein respective positions of the one or more inspection marks within each of the plurality of repeated exposure units are identical relative to each other.

11. The configuration apparatus according to claim 10, wherein the preset rule comprises:

determining a number of inspection marks located at identical positions in each of the plurality of repeated exposure units being equal; or determining a number of inspection marks located at any two positions in each of the plurality of repeated exposure units differs by less than a first threshold value.

12. The configuration apparatus according to claim 11, wherein the preset rule further comprises:

determining a number of inspection marks in any two of repeated exposure units in which the inspection marks exist being equal; or determining a number of inspection marks in any two repeated exposure units in which the inspection marks exist differs by less than a second threshold value.

13. The configuration apparatus according to claim 12, wherein the preset rule further comprises:

setting any two inspection marks having a longest distance within a repeated exposure unit as the target inspection marks.

14. The configuration apparatus according to claim 13, wherein the preset rule further comprises:

setting any three of inspection marks by which a triangle formed having a largest area within a repeated exposure unit as the target inspection marks.

15. A measurement map configuration method comprising:

providing a wafer to be inspected, wherein the wafer includes a plurality of repeated exposure units and each of the plurality of repeated exposure units includes one or more inspection marks, and respective positions of the one or more inspection marks within each of the plurality of repeated exposure units are identical;

obtaining a first inspection result based on a first set of inspection marks;

selecting, based on a preset rule, a second set of inspection marks, wherein a number of the second set of inspection marks is less than a number of the first set of inspection marks;

obtaining a second inspection result based on the second set of inspection marks, wherein an overlay accuracy of the second inspection result matches an overlay accuracy of the first inspection result;

setting a measurement map for the wafer based on target inspection marks, wherein the target inspection marks are the second set of inspection marks of the measurement map.

16. The configuration method according to claim 15, wherein the preset rule comprises:

determining a number of inspection marks located at identical positions in the plurality of repeated exposure units is equal; or determining a number of inspection marks located at any two positions in the plurality of repeated exposure units differs by less than a first threshold value.

17. The configuration method according to claim 16, wherein the preset rule further comprises:

determining a number of target inspection marks in any two repeated exposure units in which the target inspection marks exist being equal; or determining a number of target inspection marks in any two repeated exposure units in which the target inspection marks exist differs by less than a second threshold value.

18. The configuration method according to claim 17, wherein the preset rule further comprises:

setting any two inspection marks having a longest distance within a repeated exposure unit as the target inspection marks.

19. The configuration method according to claim 18, wherein the preset rule further comprises:

setting any three of inspection marks by which a triangle formed having a largest area within a repeated exposure unit as the target inspection marks.

20. The configuration method according to claim 15, wherein obtaining the first inspection result based on the first set of inspection marks comprises:

obtaining the first inspection result based on all inspection marks on the wafer.

* * * * *